May 24, 1966 W. BACHNICK ETAL 3,253,239
UHF TUNER HAVING QUARTER WAVE LENGTH TANK CIRCUIT AND CAPACITANCE DIODE FOR TUNING
Filed March 20, 1964
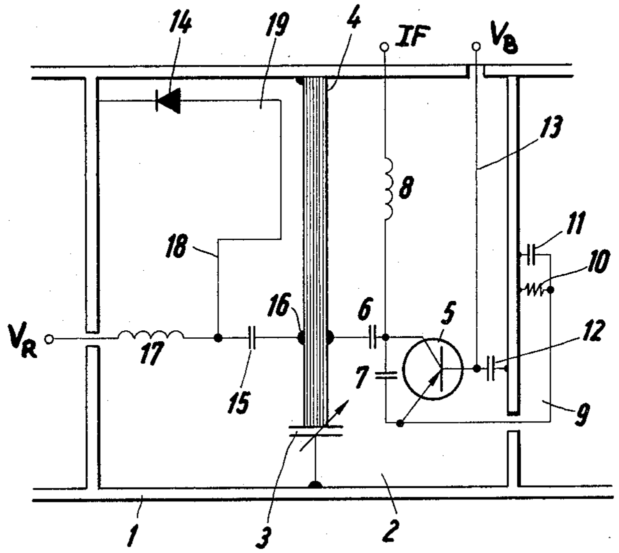
Inventors:
Werner Bachnick
Werner Heitefuss
By: Spencer & Kaye
ATTORNEYS

United States Patent Office 3,253,239

Patented May 24, 1966

3,253,239

UHF TUNER HAVING QUARTER WAVE LENGTH TANK CIRCUIT AND CAPACITANCE DIODE FOR TUNING

Werner Bachnick, Bredenbeck, and Werner Heitefuss, Hannover, Germany, assignors to Telefunken Patentverwertungsgesellschaft m.b.H., Ulm (Danube), Germany Filed Mar. 20, 1964, Ser. No. 353,502

Claims priority, application Germany, Mar. 29, 1963, T 23,732

8 Claims. (Cl. 333—83)

The present invention relates to UHF (ultra high frequency) tuners having quarter wave length tank circuits.

The oscillator frequency of UHF tuners having half wave length tank circuits may be controlled by changing the barrier layer capacitance of a crystal diode. In such a circuit, the diode is connected in series with a capacitor between ground, i.e., the outer conductor of the tank circuit, and a tap of the inner conductor, or with its connection with the oscillator tube, such that the frequency swing will be substantially constant throughout the entire frequency band in which the circuit is to operate. In the case of quarter wave length tank circuits, this capacitative coupling of the diode circuit has the drawback that the frequency swing is not constant over the frequency band because, in such quarter wave length tank circuits, the amplitude of the coupling will be different, depending on how much the frequency differs from the resonant frequency of the diode circuit. The reason for this is that the capacitative coupling of the coupling circuit becomes greater with higher frequency.

It is also known, in the case of UHF tuners with half wave length tank circuits, to transform the depletion layer capacitance inductively into the oscillator circuit. This inductive coupling of the diode has the drawback, however, that by using the so-called current antinode in the conductor circuit, the effectiveness of the coupling loop changes with the individual frequencies during a change in frequency. In the case of quarter wave length tank circuits, too, the frequency swing would, due to the tuning of the diode circuit, be different throughout the entire frequency range.

In the case of UHF tuners with quarter wave length tank circuits, the frequency of the oscillator may be changed by premagnetizing an inductance lying in the oscillator circuit by means of ferrite cores, so as to make use of the saturation effect. This has been found to have certain drawbacks.

It is, therefore, the primary object of the present invention to obtain a uniform frequency swing, over the entire frequency range in which a UHF tuner having quarter wave length tank circuits is to operate, without making use of the saturation effect. With this primary object in view, the present invention resides, basically, in that firstly, the capacitance diode is connected in series with a capacitor, which series circuit is connected between ground and the inner conductor at a point thereof which is nearer to the non-grounded, or "hot," end of the inner conductor than to the grounded end thereof, and secondly, the line connecting the diode and the inner conductor is inductively coupled with an end portion of the inner conductor which is near ground.

Additional objects and advantages of the present invention will become apparent upon consideration of the following description when taken in conjuction with the accompanying drawing in which the single figure of the drawing is a schematic diagram of a tuner according to the present invention.

Referring now to the drawing, the same shows a UHF tuner having a quarter wave length tank circuit 2 tuned capacitatively be means of a variable rotary capacitor 3 one electrode of which is connected to the "hot" or open end of the inner conductor 4 whose other end (the upper end, as viewed in the drawing) is connected to ground, i.e., to the outer conductor 1 of the tank circuit. The other electrode of the capacitor 3, i.e., the electrode which is not connected to inner conductor 4, is likewise grounded. The tank circuit 2 forms the resonant circuit of an oscillator whose amplifier stage is, in the illustrated embodiment, constituted by a transistor 5. The collector of this transistor is connected, via a capacitor 6, to a tap of the inner conductor 4 which is closer to the open end, i.e., the end at which this conductor is connected to the capacitor 3, than to the grounded end of the conductor. The emitter is connected to the collector via a capacitor 7. The intermediate frequency (IF) is derived from the oscillator, which, in the illustrated embodiment, represents a self-oscillating mixer stage, via an inductance 8. This inductance also serves as the component by means of which the negative collector voltage is applied. The emitter is grounded via a coupling loop, a resistor 10, and a capacitor 11. The high-frequency signal voltage is applied to the transistor 5 via the coupling loop 9. The base of the transistor is grounded via a capacitor 12 and receives its operating voltage $V_B$ via a lead 13. The frequency of the self-oscillating mixer, as described so far, is controlled by a capacitance diode 14 which, via a serially connected capacitor 15, is connected to a tap 16 of the inner conductor 4, and which has the control voltage $V_R$ applied to it via an inductance 17 and lead 18. This lead 18 is, throughout that portion of its length which lies near the grounded end of the conductor, fashioned as an inductive coupling loop 19. It is in this region that the most current flows, so that this is the most favorable point at which an inductive coupling can be obtained. In order to obtain good efficiency and also in order to arrive at the most uniform frequency swing possible, the coupling loop is relatively long, for example, one eighth of a wave length.

The control circuit described so far has two resonant circuits essential for the two types of couplings. One of these resonant circuits, namely, the resonant circuit which effects the inductive coupling, consists of the parallel resonant circuit formed by the inductances 17 and 19 as well as the barrier layer capacitance 14, while the capacitances 15 and 14, together with inductance 19, form a series resonant circuit. In order to obtain a substantially uniform frequency swing, the parameters of the parallel resonant circuit are so selected that its resonant frequency is lower than the minimum oscillator frequency. The series resonant circuit, on the other hand, has such parameters that its resonant frequency is higher than the maximum oscillator frequency. The first is accomplished, mainly, by the inductance 17, the second by the capacitance 15. In most cases it will be sufficient to provide the lead 18 or the inductance 17, in the region of the tap 16, with such an area, or with such spacing from the inner conductor, that the thus-obtained capacitance acts as coupling capacitance. If the inductance 17 is used, the end surface of the winding will be directed toward the inner conductor. Due to the tolerances of the circuit components, there should be a precautionary separation between the resonant frequencies. Insofar as the frequency swing is concerned, it is advantageous if the winding is such that the resonant frequency is as close as possible to the extreme oscillator frequencies; the separation must, however, be carefully maintained.

Thanks to the above arrangement, the overlapping of the two types of coupling produces a substantially uniform frequency swing throughout the entire frequency band in which the oscillator is to operate.

The magnitude of the coupling capacitance can be varied by connecting the capacitance 15 to the collector of transistor 5, in which case the two capacitors 15 and 6 will be connected in series with each other, the total capacitance of this series circuit being such as to satisfy the requirements of the tuner.

The present invention is not limited to UHF tuners in which the amplifier stage is constituted by transistor means, instead, the invention is equally applicable to tuners in which the amplifier stage incorporates electron tubes.

With one embodiment of the invention there have been used following circuit elements:

| | | |
|---|---|---|
| Diode 14 | | BA110 |
| Transistor 5 | | Texas Instruments GM0290 |
| Capacitor 6 | picofarads | 6.5 |
| Capacitor 3 | do | 2–14 |
| Capacitor 15 | do | 0.8–2 |
| Capacitor 7 | do | 0.6 |
| Capacitor 11 | do | 200 |
| Capacitor 12 | do | 200 |
| Inductance 8 | microhenry | 0.3 |
| Inductance 17 | nanohenries | 25 |
| Coupling loop 9 | do | ~30 |
| Resistor 10 | kilo-ohm | 1 |

It will be understood that the above description of the present invention is susceptible to various modifications, changes and adaptations, and the same are intended to be comprehended within the meaning and range of equivalents of the appended claims.

What is claimed is:

1. In a UFH tuner, the combination which comprises:
   (a) a quarter wave length tank circuit having an inner conductor one end of which is grounded and the other end of which is electrically spaced from ground;
   (b) a capacitance diode;
   (c) a capacitor; and
   (d) connecting means connecting said capacitor and said capacitance diode in series circuit with each other, said series circuit being connected between ground and a point on said inner conductor which is closer to said other end thereof than to said grounded end thereof, said connecting means being inductively coupled with a portion of said inner conductor which is near said grounded end thereof.

2. The combination defined in claim 1 wherein said connecting means include a lead and wherein said diode is capacitatively coupled to said inner conductor by the spacing of a portion of said lead from said inner conductor.

3. The combination defined in claim 1 wherein said connecting means incorporate a coupling loop which is inductively coupled with said portion of said inner conductor.

4. The combination defined in claim 3, further comprising an inductor connected to said diode for applying a control voltage thereto, the inductance of said inductor being such that the parallel resonant frequency of the circuit constituted by said coupling loop, said inductance and the capacitance of said diode is lower than the minimum oscillator frequency of said tank circuit.

5. The combination defined in claim 3 wherein the series resonant frequency of the circuit constituted by the capacitance of the coupling capacitor, the capacitance of said diode and the inductance of said coupling loop is higher than the maximum oscillator frequency of said tank circuit.

6. A UHF tuner comprising, in combination:
   (a) a quarter wave length tank circuit having an outer conductor constituting ground and an inner conductor one end of which is connected to said outer conductor and the other end of which is spaced from said outer conductor, thereby to be non-grounded;
   (b) a first capacitor having one electrode connected to said non-grounded end of said inner conductor and another electrode which is grounded;
   (c) a second capacitor;
   (d) a capacitance diode; and
   (e) means connecting said second capacitor and said capacitance diode in series-circuit with each other, said series circuit being connected between ground and a tap on said inner conductor which is closer to said non-grounded end thereof than to said grounded end thereof, said connecting means including a lead a portion of which is fashioned as a coupling loop which is inductively coupled with a portion of said inner conductor which is close to said grounded end thereof.

7. A tuner as defined in claim 6, further comprising an inductance connected to said diode for applying a control voltage thereto.

8. A tuner as defined in claim 7, further comprising an amplifier stage, connected to said tap of said inner conductor.

No references cited.

HERMAN KARL SAALBACH, *Primary Examiner.*